United States Patent [19]

Mitani et al.

[11] 4,324,815
[45] Apr. 13, 1982

[54] SCREEN-PRINTING MASK AND METHOD

[75] Inventors: Minoru Mitani; Kiyoharu Hashimoto; Kenjiro Ninomiya; Tochikiyo Miyazaki; Otokuma Hashimoto; Hideki Mori, all of Fuchu, Japan

[73] Assignee: Mitani Electronics Industry Corp., Tokyo, Japan

[21] Appl. No.: 166,338

[22] Filed: Jul. 7, 1980

Related U.S. Application Data

[62] Division of Ser. No. 957,187, Nov. 2, 1978, Pat. No. 4,242,401.

[51] Int. Cl.³ .......................... B05D 1/36; H05K 3/12
[52] U.S. Cl. .................................. 427/96; 101/129; 427/266; 427/282; 427/286; 427/287; 428/201; 428/210; 427/265

[58] Field of Search ................ 101/127, 128.21, 128.4, 101/129; 118/504, 505; 427/258, 265, 272, 282, 286, 266, 287, 96; 428/195, 196, 209, 247, 255, 256, 199, 201, 210

[56] References Cited

U.S. PATENT DOCUMENTS 3,538,847 11/1970 Heilman .......................... 101/128.3
3,759,799 9/1973 Reinke .............................. 96/36.4

FOREIGN PATENT DOCUMENTS 51-2974 12/1976 Japan ............................... 101/128.2

Primary Examiner—Bruce H. Hess
Attorney, Agent, or Firm—Seed, Berry, Vernon & Baynham

[57] ABSTRACT

A method of forming a film or fine line which is very thick in comparison with its width, by repeated printings with heterogeneous or homogeneous printing pastes by using a screen-printing mask. A screen-printing mask having spacing means formed thereon for spacing the screen apart from the work surface.

10 Claims, 21 Drawing Figures

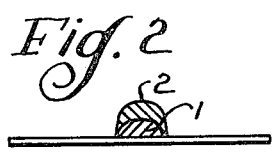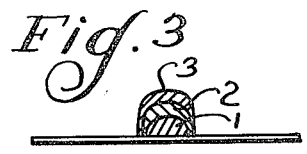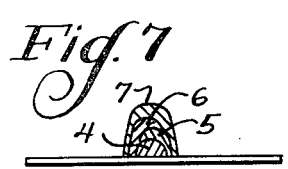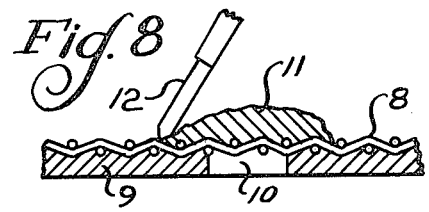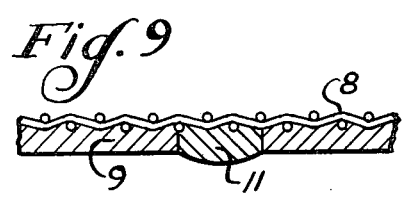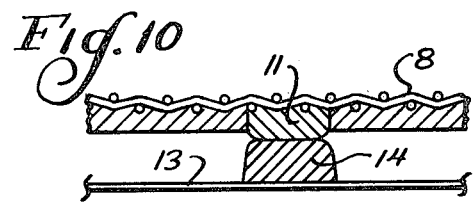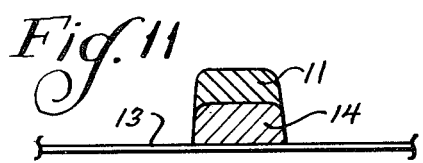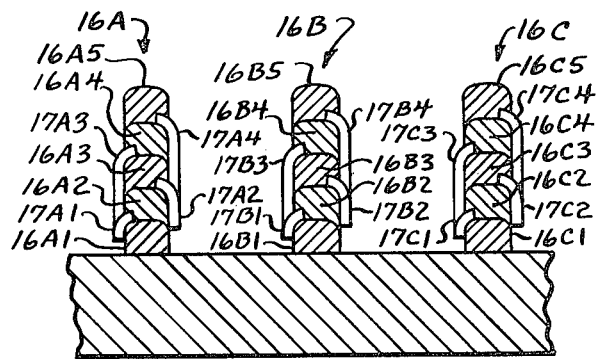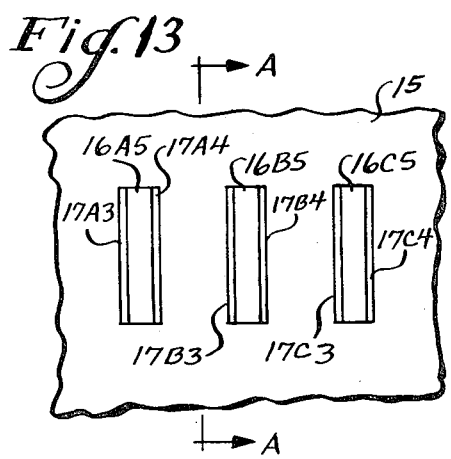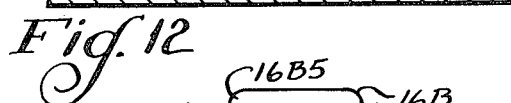

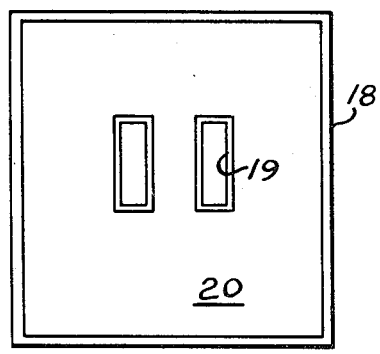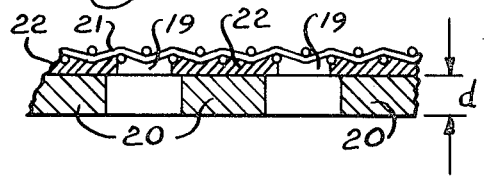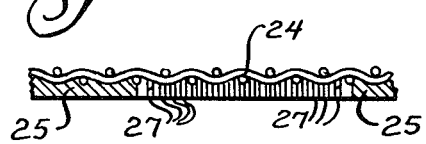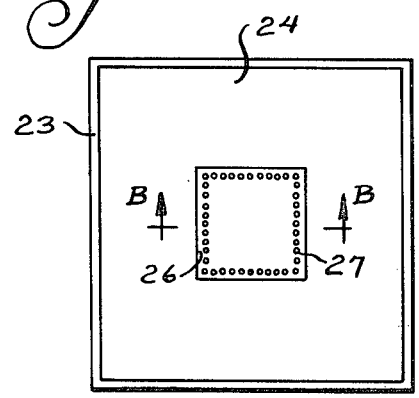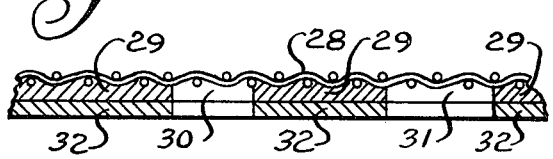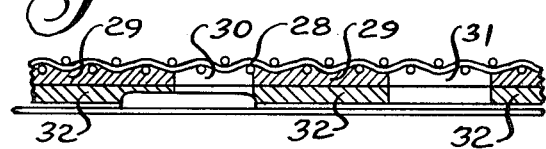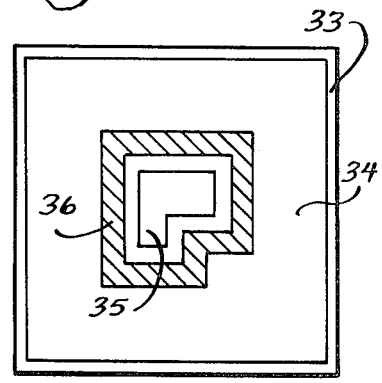

SCREEN-PRINTING MASK AND METHOD

This is a division of application Ser. No. 957,187, filed Nov. 2, 1978, now U.S. Pat. No. 4,242,401.

DESCRIPTION

The present invention relates to a film or line element which is produced by a screen-printing process. The film or line element is very thick in comparison with its width. The invention also relates to a method for industrially producing such a film or line element. The present invention further relates to equipment such as a screen-printing mask to be used for embodying the above method.

It is generally impossible to form a line or film having a line width of, for example, 0.2 mm and a thickness of, for example, more than 0.2 mm by a single printing using a screen-printing mask because the fluidity of the printing paste forming the thick film causes the paste itself to flatten, resulting in an increase of the line width. A conventional method employed for forming a thick film is to repeatedly form a film of from 10 to 20 microns, $\mu$, in thickness each time by using a screen mask of, for example, 0.2 millimeters, mm, in line width and 10 to 20$\mu$ in thickness. In this method, if a layer is superimposed on the preceding layers which have dried, the preceding layers are collapsed by the printing pressure of the squeegee used, and thus it is difficult to form a line or film of a needed thickness and width. For this reason, it is necessary to harden the film layer formed by each printing by sintering the layer after each printing. This not only makes the process complex and maintenance of accuracy difficult, but also fails to provide for mass production and reasonable production costs. Further, since the preceding layers have been hardened, the superimposed top layer flows and spreads in the lateral directions on the preceding layers, making it difficult to obtain film of a desired thickness.

For example, in the case of printing a circuit element having a width of 100$\mu$ by using a screen-printing method, if a screen mask having a stainless-steel meshwork of 400 meshes and a circuit pattern film thickness of 20$\mu$ is used, a total film thickness of approximately 70$\mu$ results. An Au paste of 200,000 centipoise viscosity and a squeegee of polyurethane rubber about 70 in hardness is used. Printing is effected with a clearance of about 0.4 mm between the to-be-printed material and screen mask. A printing speed of 200 mm per second and a printing pressure of 5 kg/cm$^2$ are also used. This also results in the element thickness after printing being 20 to 30$\mu$, and the thickness after drying being 15 to 20$\mu$. This happens because it is generally known that a film thickness of about ⅓ the thickness of the screen mask can be obtained. When the film after drying is sintered, the thickness will be 8 to 12$\mu$, which is about 40 to 60% of the film after drying. If a greater film thickness after sintering is desired, by changing the above parameters, for example, making the total thickness of the screen plate 80$\mu$ and the viscosity of the paste 300,000 centipoises, the film thickness after printing and drying will be 20 to 25$\mu$.

In case that a film of greater thickness, for example, 100 to 500$\mu$ after sintering, were desired to be formed, the desired result would not be obtainable merely by changing the above-mentioned parameters. it is fairly difficult to further increase the thickness of the screen mask so as to distinguish fine lines of less than 100$\mu$. If such a screen were obtained and printing were done with it, the pattern would be deformed before drying and solidification after the transfer of paste to the to-be-printed material because the paste would gradually flow down from the top of a printed film, increasing the width and decreasing the height (thickness) of the film. As a result, the desired film thickness would not be obtained.

Repeated printings with one screen mask are possible for obtaining a certain film thickness, but this method does not achieve desirable dimensional accuracy because of the slight error in positional setting for each printing step and the error due to flowing of the paste.

As stated in the foregoing, it has conventionally not been possible to obtain thick films, especially, in the case where the film width is small. It has been virtually impossible to obtain a printed line or film structure which maintains a desired width and still has a film thickness greater than the film width.

For forming an electric insulator layer on a substrate in the form of a grid of constantly spaced stripes by using a screen-printing method and also for forming conductive films, which are independent from each other, on the side walls of an insulator layer, a conventional technique provides for the formation of an insulator layer, formation of a conductive film to cover the insulator layer by means of a chemical plating, a vacuum evaporation, or some other process, and removal of unnecessary portions of the conductive film by means of a photo-etching or other process thereafter. These and other conventional methods involve a number of processes, and are accompanied with high production costs because of the need for photo-etching or other process. They are not very practical. For printing a large area by a screen-printing process, it is necessary to consider balancing two factors, which contradict each other, according to the particular situation. One of the two factors is the elasticity of the screen mask being used. A screen mask needs to be elastic because in case of printing over a large area, for example, a 300 mm square, the proper distance between the screen mask and the material to be printed must be maintained. At the time of applying printing pressure with a squeegee, the screen mask must flexibly act on the material to be printed and then must depart from it by means of its elasticity. The other factor is the elongation of the screen mask being used. The screen mask should not be elongated despite its elasticity. The elasticity causes the pattern formed on the screen mask to vary its dimensions, having an adverse effect on the reproducibility of, for example, printed circuit. A sheet of foil patterned by etching or other means is sometimes used for screen printing since it is regarded as one of the techniques producing little elongation.

Balancing the above-described two contradictory factors so as to satisfy the requirements of a particular job is necessary to realize a precisely printed pattern, especially when screen printing a large area. A screen that meets those requirements has a high snap-back characteristic with little pattern elongation.

An object of the present invention is to overcome the above-described and other limitations of conventional techniques for screen printing by providing thick and narrow films or line elements and by providing a method to industrially produce such films or line elements.

Another object of the present invention is to provide a method for printing a thick film by forming layers of printing pastes, the lower layer or layers being simply dried, without deforming the shape of layers to thereby provide a film of a desired thickness.

Still another object of the present invention is to provide a novel method for forming an insulator layer by using a screen printing method and for simultaneously forming conductive films on the side walls of the insulator layer.

Still another object of the present invention is to provide an improved screen-printing mask to be used for embodying the above methods.

According to the present invention there is provided a method of producing a thick and narrow film or line element, comprising forming fine line and thick layers by repeated printings with various printing pastes by using a screen-printing mask to thereby obtain a preset width and thickness of the linear film in the final printing step.

According to another aspect of the present invention, there is provided a thick-film printing method which includes letting a screen-printing mask, the printing pattern opening portions of which are filled with printing paste by a squeegee, touch a film layer or layers printed and dried on a substrate by a screen-printing method, and laying the printing paste on said layer or layers without deforming the shape of the layer or layers.

According to still another aspect of the present invention, a method of forming conductive films on the side walls of each of electric insulator layers includes forming electric insulator layers in the shape of a grid of constantly spaced stripes on a substrate of glass, ceramics or other suitable material and forming conductive films, which are independent of each other, on the opposite side walls of each electric insulator layer.

A method according to the present invention is characterized by alternately repeating by means of a screen-printing mask the formation of electric insulator layers and the formation of conductive films on the side wall of the electric insulator layers, printing with printing pastes to form conductive films which are deviated alternately toward either one of the side walls with respect to the electric insulator layer, and letting the printing pastes on the side walls of the electric-insulator layers produced by the repeated printings continue by means of their fluidity to form independent conductive film on each side wall.

A screen-printing mask to be used for embodying a method according to the present invention has at least a part of the screen, excluding the circumferential edge portion of the pattern to be printed, provided with a layer having a thickness corresponding to the height of a projection on which the pattern will be printed.

A screen-printing mask having a pattern-forming layer provided on the bottom side thereof for forming a print pattern to be used for embodying a method according to the present invention is formed by providing the bottom side of the screen with many small-diametered mounding preventive projections located at intervals closely along the edge of the print pattern so that the edge of the printed pattern may be prevented from forming local mounds at the time of printing.

A screen-printing mask to be used for embodying a method according to the present invention has part of or the whole of the surface of the pattern-forming metallic layer for forming a print pattern provided with an emulsion layer.

A screen-printing mask to be used for embodying a method according to the present invention is provided with a screen and an emulsion coated on the screen, preventing the screen meshes in the peripheral section that have no effect on the screen pattern from deviating from their position by having the screen wire intersections joined together.

For better understanding of the present invention, reference is made to the following detailed disclosure of the preferred embodiments of the invention taken in conjunction with the accompanying drawings thereof, wherein:

FIGS. 1 to 3 are cross-sectional, elevational views showing a relatively thick line element produced according to the method of the present invention;

FIGS. 4 to 7 are cross-sectional, elevational views showing a line element produced by a method according to the present invention;

FIGS. 8 to 11 are cross-sectional, elevational views showing apparatus and material for producing a thick film using the thick-film printing method according to the present invention;

FIGS. 12 to 14 are views showing line elements produced by a method according to the present invention, FIG. 12 being a cross-sectional, elevational view, FIG. 13 being a plan view, and FIG. 14 being a cross-sectional view along a line A—A in FIG. 13;

FIG. 15 is a bottom view of a screen-printing mask according to the present invention;

FIG. 16 is a cross-sectional, elevational view showing an enlarged part of the mask in FIG. 15;

FIG. 17 is a top view of another screen-printing mask according to the present invention;

FIG. 18 is a cross-sectional view taken along arrows B—B in FIG. 17;

FIGS. 19 and 20 are cross-sectional views showing a part of still other screen-printing masks according to the present invention; and FIG. 21 is a plan view showing another screen-printing mask according to the present invention.

With reference to FIGS. 1 to 3, the step-by-step buildup of a line element is shown. As shown in FIG. 1, the first layer 1 is printed on a substrate by using a screen mask which is provided with a print pattern having a line width smaller than the desired final line width, taking the fluidity of the paste to be used into account. The second process step produces as shown in FIG. 2 a second layer 2 which is printed and superimposed on the first layer 1 by using a screen mask which is provided with a print pattern having a line width which is greater than the line width used for the first process but smaller than the final line width. Thereafter, as shown in FIG. 3, the third layer 3 is printed superimposed on the second layer 2 by using a screen mask having a width which is slightly smaller than the line width to be finally obtained. By this method, positional deviations due to the first and second process steps can be compensated for and a thick film meeting design specifications (namely, a certain line width and thickness) can be formed.

More particularly, in one example, a screen mask having a line width of 60$\mu$ was used for printing in the first process step, a screen mask having a pattern line width of 70$\mu$ was used for printing in the second process step, and a screen mask having a pattern line width of 90$\mu$ was used for printing in the third process step so that a line element 100$\mu$ in width and 50$\mu$ in film thickness was formed. In this example, errors due to the first and second process steps were compensated for, and the line width and film thickness required were obtained.

With reference to FIGS. 4 to 7, which show a modified version of a line element produced according to the present invention, it is clear from FIGS. 5 and 6 that a second layer 5 and a third layer 6 are formed deviated rightwardly and leftwardly, respectively, with respect to a first layer 4 formed by the first process step (FIG. 4). In the final process step as shown in FIG. 7, a fourth layer 7 is formed covering the first, second and third layers 4, 5, and 6.

The following table shows process parameters for printing on a 300×300 mm area:

| | Mesh Size | Emulsion Thickness | Screen Tension | Screen/ Material Spacing | Squeegee Hardness | Print Speed (mm/sec) | Viscosity of Paste |
|---|---|---|---|---|---|---|---|
| First Step | 400 | 20 μ | 10kg | 0.4–0.5mm | 70 | 200 | 300,000cP |
| Second Step | 400 | 20 μ | 10kg | 0.5–0.6mm | 70 | 200 | 200,000cP |
| Third Step | 400 | 25 μ | 10kg | 0.5–0.6mm | 70 | 200 | 200,000cP |
| Fourth Step | 400 | 30 μ | 8kg | 0.6–0.7mm | 60 | 200 | 100,000cP |

The various printing pastes to be used in the individual processes of either of the above-described two embodiments may be either heterogeneous pastes or homogeneous pastes, as required.

From the above, a line element manufactured according to the present invention is characterized in that it comprises a plurality of layers (layers 1, 2, and 3 in FIG. 3 or layers 4, 5, 6, and 7 in FIG. 7) printed with screen-printing pastes which are heterogeneous or homogeneous, that the bottommost layer (layer 1 or layer 4) has a width smaller than the planned final width, and that the topmost layer (layer 3 or layer 7) determines the final line width and thickness.

With reference to FIGS. 8 to 11, which briefly show apparatus for another embodiment of a method according to the present invention, 8 is the wire meshwork of a printing mask, 9 is a film which forms a print pattern 10, 11 is a printing paste, 12 is a squeegee, 13 is a substrate to be printed upon, and 14 is a film layer printed on the substrate 13.

FIG. 8 shows the apparatus and material in which the print pattern opening 10 of the screen-printing mask is filled with printing paste 11 by using the squeegee 12. The volume of the printing paste 11 used to fill the print pattern opening 10 may be a little greater than necessary. FIG. 9 shows the printing mask having the print pattern opening 10 filled with printing paste 11.

The screen-printing mask having the print pattern opening 10 filled with printing paste 11 is next positioned above a film layer 14 which has already been printed on the substrate 13 by a screen-printing method and then dried. The paste touches the layer 14 as shown in FIG. 10. In this condition, by lightly sweeping the screen-printing mask with a squeegee (not shown) which is preferably made of rubber or another very soft material, the printing paste 11 in the print pattern opening 10 is transferred onto the film layer 14 previously having been printed on the substrate 13. Since the film layer 14 has been dried as mentioned above, solvent in the paste 11 is absorbed by the film layer 14, therefore, the layer of paste 11 does not flow laterally but rests on the film layer 14 as shown in FIG. 11, producing a precise pattern. By repeating the above process steps, a thick line or film having a desired thickness and width can be produced by transfer printing.

With reference to FIGS. 12 to 14, which show line elements produced by a third embodiment of a method according to the present invention, a substrate 15 made of glass, ceramics, or other suitable material is provided with four layers of an electric insulator laminated together in the form of a grid of constantly spaced stripes (three laminated stripes 16A, 16B, and 16C are illustrated). Each of the layers 16A1 to 16A4, 16B1 to 16B4, and 16C1 to 16C4 of the electric insulator laminations 16A, 16B, and 16C are screen-printed to have a thickness of about 50μ.

The first layers 16A1, 16B1, and 16C1 of glass or other suitable materials are printed in the form of a grid of stripes 50 μ thick on the substrate 15 by screen-printing. Next, the first conductive films 17A1, 17B1, and 17C1 are printed on the first layers 16A1, 16B1, and 16C1, respectively, In this process, printing of the conductive films is effected with the pattern openings of the screen-printing mask deviated leftward, as shown in FIG. 12, by less than half of the width of the first layers 16A1, 16B1, and 16C1, respectively, so that the conductive printing paste may flow on the left side wall of the first layers 16A1, 16B1, and 16C1, respectively, and the bottom end of the paste may or may not touch the substrate 15, as required.

Next, the second layers 16A2, 16B2, and 16C2 are printed on the corresponding first layers 16A1, 16B1, and 16C1 to about the same thickness as the first layer. Thereafter, the second conductive films 17A2, 17B2, and 17C2 are printed on the second layers in the same manner as were the first conductive films so that the printing paste flows on the right side wall of the second layers, respectively, which is located opposite to the side on which the first conductive films 17A1, 17B1, and 17C1 were formed. By alternately repeating these processes, a structure with a cross section as shown in FIG. 12 is formed. The first conductive films 17A1, 17B1, and 17C1 are connected to third conductive films 17A3, 17B3, and 17C3, respectively, to form a conductive film on the left side wall of the electric insulator laminations 16A, 16B, and 16C, respectively. Similarly, the second conductive films 17A2, 17B2, and 17C2 are connected to the fourth conductive films 17A4, 17B4, and 17C4, respectively, to form a conductive film on the right side wall. Each of these conductive films thus formed may be connected to a lead terminal (not shown) as required.

As in the above, by simply repeating printing process steps as many times as required, insulator laminations of a required thickness in the form of a grid of stripes are formed. Independent conductive films can simply and easily be formed on their side walls.

It should be appreciated that the conductive films formed on the two sides of each of the insulator laminations by alternately deviating the printing mask right and left and/or back and forth with respect to the insulator laminations are insulated from each other.

Four examples of the screen-printing masks to be used for carrying out the above-described methods according to the present invention will be explained below.

With reference to FIG. 15, which shows a screen-printing mask to be used for embodying a method according to the present invention, 18 is a frame, 19 is a pattern to be printed, and 20 is an emulsion layer. As may be seen from FIG. 16, this mask comrpises a wire meshwork 21 set on the frame 18. The meshwork 21 is provided with an emulsion layer 22 formed with resin and other material may be used, including, for example, metal foil or other suitable material. Another emulsion layer 20 having a thickness d that corresponds to the height of the projections (not shown) on which printing will take place is formed on the layer 22. This layer 20 is formed so as to exclude the circumferential edge portions of emulsion layer 22 that defines the pattern 19 to be printed.

The mask as described above is used, for example, as will be briefly described in the following. For printing on a flat surface, the mask without the layer 20 is used. For printing the same pattern so as to superimpose it on projecting portions previously, for example, printing as above described, the mask is provided with a layer 20 whose thickness corresponds to the height of the projections formed previously. By repeated printing in this manner, a desired pattern of a desired thickness is obtained.

With reference to FIGS. 17 and 18, which show another screen-printing mask to be used for embodying a method according to the present invention, 23 is a frame, and 24 is the screen set on the frame 23. On the bottom side of the screen 24 is a pattern-forming layer 25 for forming a print pattern 26 as shown in FIG. 18. Also on the bottom side of the screen 24 are many small-diametered mounding-preventive projections 27, which are formed at close intervals along the circumferential edge of the print pattern 26. The projections 27 are formed, for example, from small pins, or the like, imbedded in the screen 24. A portion of the screen 24 forming the print pattern 26 is symbolically shown in FIG. 18. Since the screen has a fine wire mesh, the actual size of the wires forming screen 24 are smaller than the projecting pins 27. The screen wires, as described hereinabove, may be stainless steel. The dimensions and number of the projections 27 may be appropriately determined by considering the area of the print pattern 26, the intended application, and other factors.

FIG. 19 shows the cross section of a part of another screen-printing mask to be used for carrying out a method according to the present invention. In this drawing, 28 is a screen meshwork, underneath which is a pattern-forming metallic layer 29 which forms print patterns 30 and 31. On the surface of this metallic layer 29 an emulsion layer 32, for example, a resin layer, in the same form as that of the metallic layer 29 is formed. This arrangement assures, because of the elasticity of the emulsion layer 32, that the mask makes tight contact with the surface to be printed, as shown in FIG. 20, even in case of multi-layered printing. As a result, a desired pattern can be precisely printed.

In the arrangement shown in FIG. 21, a screen-printing mask comprises a frame 33, a screen 34 set on the frame 33, and a print pattern 35 provided on the screen 34. The screen meshes in the peripheral section 36 that have no effect on the pattern 35 are coated with emulsion so as to prevent the meshes in said peripheral section 36 from deviating from their positions.

As described in the foregoing, by means of a method according to the present invention, not only is it possible to form a thick line or film that is virtually impossible to be formed by a conventional screen-printing process, but it is also possible to greatly improve pattern accuracy as well as improve industrial production. Since the production steps required are comparatively simple, production costs can also be reduced.

A method according to the present invention may be especially profitable for use in manufacturing electrodes for electric discharge display devices, resulting in decreased production costs for electric discharge display devices.

By using screen-printing masks according to the present invention, a pattern to be printed can be formed by layers of even thickness. This results in the electrical characteristics of the circuit elements formed to be free of nonuniformities so that when used as elements of a circuit, excellent performance characteristics are obtained. Thus, in application, excellent performance and distinct advantages are obtained. A screen-printing mask according to the present invention may be employed in the manufacture and printing of printed-circuit elements, the dimensions of which are very uniform and the characteristics of which are stable. Even in case of multi-layer construction processes, such as those used to fabricate hybrid integrated circuits, the metal and double emulsion structure of the pattern of the mask permits a substrate and a mask to be placed in tight contact with each other, resulting in high dimensional uniformity and highly stable characteristics.

It is possible to obtain better contact with a photo-mask by obtaining better flatness which is achieved by polishing the surface of the emulsion coated on the screen meshes. Surface flatness is also achieved by polishing the surface of the patterned screen mask. By reducing the surface roughness by either one of the above methods, tight contact with the material to be printed can be obtained and a sharp line can be printed thereupon as a result.

The foregoing description is intended to set forth examples of the present invention and many changes and modifications are possible without departing from the true spirit and scope of the present invention. It is therefore contemplated to cover by the present application any and all such modifications that fall within the true spirit and scope of the basic underlying principles disclosed and claimed herein.

What is claimed is:

1. A method of printing a thick film line element on a substrate, comprising:
    (a) applying a relatively thin line of printing paste to substrate to form a line element;
    (b) allowing said printing paste to dry so that its viscosity is greatly increased;
    (c) filling an elongated printing pattern opening of a screen-printing mask with printing paste, said printing pattern having a size and shape corresponding to the size and shape of the previously applied line of printing paste;

(d) superimposing the printing pattern of said screen-printing mask on the previously applied line element, with the underside of the printing paste that fills said printing pattern contacting an exposed surface of said line element;

(e) moving said screen-printing mask away from said substrate while allowing said printing paste to remain in contact with the previously applied line element, thereby applying another line element to the previously applied line element; and (f) repeating steps b-e as desired until a line element of printing paste having a predetermined thickness has been applied to said substrate.

2. The method of claim 1 wherein the printing pattern of said mask is filled with printing paste by placing a quantity of said printing paste on a surface of said mask and forcing said printing paste into said printing pattern with a squeegee.

3. The method of claim 1 wherein the underside of the screen-printing mask used to apply a line of printing paste to a previously applied line of printing paste contains spacer means having a thickness approximately equal to the thickness of said previously applied line elements, said method including the step of placing said spacer means in contact with said substrate as the printing pattern of said screen-printing mask is superimposed on said previously applied line element so that the printing paste that fills said print pattern slightly contacts the previously applied line element.

4. The method of claim 3 wherein said spacer means is a layer of an emulsion formed on the underside of said screen and surrounding said print pattern, said emulsion having a thickness corresponding to the thickness of said previously applied line elements, thereby forming a void beneath said print pattern.

5. The method of claim 4 wherein said void overlaps said print pattern to provide clearance between said emulsion layer and the previously applied line elements.

6. The method of claim 4 wherein said emulsion is resilient so that it is capable of providing tight contact between said mask and substrate.

7. The method of claim 3 wherein said spacer means includes a plurality of small-diametered, mounding-preventive projections on the underside of said screen along the edge of said print pattern.

8. A method of printing a thick film line element on a substrate, comprising:

(a) applying a relatively thin line of insulative printing paste to said substrate;

(b) applying a relatively thin line of conductive printing paste along one side of the previously applied line of insulative printing paste, with the conductive printing paste contacting any line of conductive printing paste previously applied to that side of said line of insulative printing paste;

(c) applying another relatively thin line of insulative printing paste to and directly over the previously applied line of insulative printing paste;

(d) applying another relatively thin line of conductive printing paste along the side of the lines of insulative printing paste opposite the previously applied line of conductive printing paste, with the conductive printing paste contacting any line of conductive printing paste previously applied to that side of said line of insulative printing paste;

(e) applying another relatively thin line of insulative printing paste to and directly over the previously applied line of insulative printing paste; and (f) repeating steps b-e as desired until a line element having a predetermined thickness has been applied to said substrate.

9. The method of claim 8 wherein said printing pastes are applied with a screen-printing mask having an elongated print pattern, with said lines of insulative printing paste being applied by superimposing said print pattern directly over a previously applied line of insulative printing paste and said line of conductive printing paste being applied by offsetting said print pattern to either side of the lines of insulative printing paste.

10. A method of printing a thick film line having a predetermined width and thickness on a substrate, comprising:

(a) applying a line of printing paste to said substrate, said line having a width and thickness which is less than said predetermined width and thickness;

(b) allowing said printing paste to dry so that its viscosity is greatly increased; and (c) repetitively applying a line of printing paste to the previously applied line after said line has hardened until said predetermined thickness has been reached, the width of each line prior to the last line to be printed being less than said predetermined width but progressively increasing as each line is printed until the final line having said predetermined width is printed, whereby successively printed lines cover the top and overlap the sides of previously printed lines.

* * * * *